United States Patent [19]

Windischmann

[11] Patent Number: 4,673,475

[45] Date of Patent: Jun. 16, 1987

[54] DUAL ION BEAM DEPOSITION OF DENSE FILMS

[75] Inventor: Henry Windischmann, Solon, Ohio

[73] Assignee: The Standard Oil Company, Cleveland, Ohio

[21] Appl. No.: 749,833

[22] Filed: Jun. 28, 1985

[51] Int. Cl.$^4$ ............................................. C23C 14/46
[52] U.S. Cl. ........................... 204/192.11; 204/192.25
[58] Field of Search ............ 204/192 R, 192 C, 192 S, 204/192.11

[56] References Cited

U.S. PATENT DOCUMENTS 4,376,688  3/1983  Ceasar ................................. 204/192

FOREIGN PATENT DOCUMENTS 149549    7/1981  German Democratic Rep.
4749987  12/1972  Japan

OTHER PUBLICATIONS

Leon I. Maissel et al, Handbook of Thin Film Technology, McGraw-Hill Book Co., New York, 1970, pp. 3-15 to 3-24, 4-26 to 4-31.
J. L. Vossen et al, Thin Film Processes, Academic Press, New York, 1978, pp. 189-198.
Brodsky et al., Doping of Sputtered Amorphous Semiconductors, 19, IBM Tech. Disc. Bull., 4802-03 (1977).
Cuomo et al., Multicomponent Film Deposition by Target Biasing, 23, IBM Tech. Disc. Bull., 817-818 (1980).
Weissmantel, Preparation of Hard Coatings by Ion Beam Methods, 63, Thin Solid Films, 315-25 (1979).
Weissmantel et al., Structure and Properties of Quasi--Amorphous Films Prepared by Ion Beam Techniques, 72, Thin Solid Films, 19-31 (1980).

Primary Examiner—John F. Niebling
Assistant Examiner—William T. Leader
Attorney, Agent, or Firm—Jeffrey A. Wyand; Joseph G. Curatolo; Larry W. Evans

[57] ABSTRACT

A novel dual ion beam sputtering process for depositing thin films of high density is described. One of the ion beams contains relatively heavy sputtering ions, such as argon ions, for ejecting atoms from a target. The second ion beam is also directed at the target and contains ions having energies of at least 3 electron volts and less than 20 electron volts. The products of the beams are collected on a substrate as a thin film. High density, hydrogenated amorphous semiconductor films, oxide and nitride films, and other films, may be deposited according to the process. The films have densities nearly equal those observed for bulk samples of the same materials. Hydrogenated amorphous silicon films deposited by the process exhibit enhanced photoconductivity.

6 Claims, 3 Drawing Figures

DUAL ION BEAM DEPOSITION OF DENSE FILMS

BACKGROUND

The technique of thin film deposition by ion beam sputtering is well established. In the typical process an ion beam of relatively heavy ions is directed at a target to cause ejection of atomic particles. These particles are collected on a substrate to form a film. In some variations of the technique, two ion beam sources are used; usually a sputtering beam is directed at a target and the second beam is directed at the depositing film. For a general description of these techniques see Weissmantel, et al., Preparation of Hard Coatings By Ion Beam Methods, 63 Thin Film Solids, 315-325 (1979), which is incorporated herein by reference.

An improved technique for dual beam deposition of thin films has recently been devised. In this technique, a sputtering ion beam is directed at a target and the second ion beam is also directed at the target, rather than at the depositing film. For example, the target may be silicon and the second beam may be hydrogen ions. Improved hydrogenated amorphous silicon films may be prepared by this process. See U.S. patent application Ser. No. 647,208 filed Sept. 4, 1984, assigned to the assignee of the present application, the disclosure of which is incorporated herein by reference. This new technique may also be used to deposit hydrogenated semiconductor alloys by employing two ion beam sources for each element of the alloy film. See U.S. patent application Ser. No. 653,168 filed Sept. 28, 1984 assigned to the assignee of the present application, the disclosure of which is incorporated herein by reference.

While the referenced techniques can provide electronic quality semiconductor films, it is also desirable to deposit high density films for use as diffusion masks in integrated circuit manufacture and for use as corrosion and wear resistant coatings on metals. Amorphous films of acceptable density for such applications are usually achieved only by high temperature post-deposition treatments. The temperatures necessary to improve film density can have a detrimental effect on the substrate, particularly if the substrate is an integrated circuit. Accordingly, there is a need for a low temperature technique for depositing dense amorphous films.

SUMMARY OF THE INVENTION

In the invention a novel dual ion beam process is used to deposit thin films, for example, amorphous hydrogenated silicon, silicon oxides, nitrides and other compounds, having densities very near the bulk values of the deposited materials, on substrates maintained at temperatures between 20° C. and 400° C. In the novel process a beam of relatively heavy sputtering ions, such as argon ions, is directed at a target. A second beam of ions of relatively low energy is also directed at the target. These low energy ions, may be hydrogen, oxygen, nitrogen or other ions and typically have energies less than about 20 electron volts, but not less than about 4 electron volts.

The low energy ions combine with the target atoms or atoms sputtered from the target to form the deposition species either as atoms or molecules that are collected on a substrate. The deposition species impact the substrate with relatively low energy depositing a much denser film than otherwise observed in deposition by sputtering.

In contrast to known dual ion beam processes, in the new process, the low arrival energy of the deposition species reduces structural disorder or defect formation in the deposited film producing the higher density.

The resulting thin films show densities and dielectric constants at or very near the values usually measured only for bulk samples of the deposited materials. Hydrogenated amorphous silicon films deposited according to the process show increases in photoconductivity by about an order of magnitude or more over the best similar films deposited by previously known dual ion beam techniques.

DETAILED DESCRIPTION OF PREFERRED EMBODIMENTS

Figure 1:
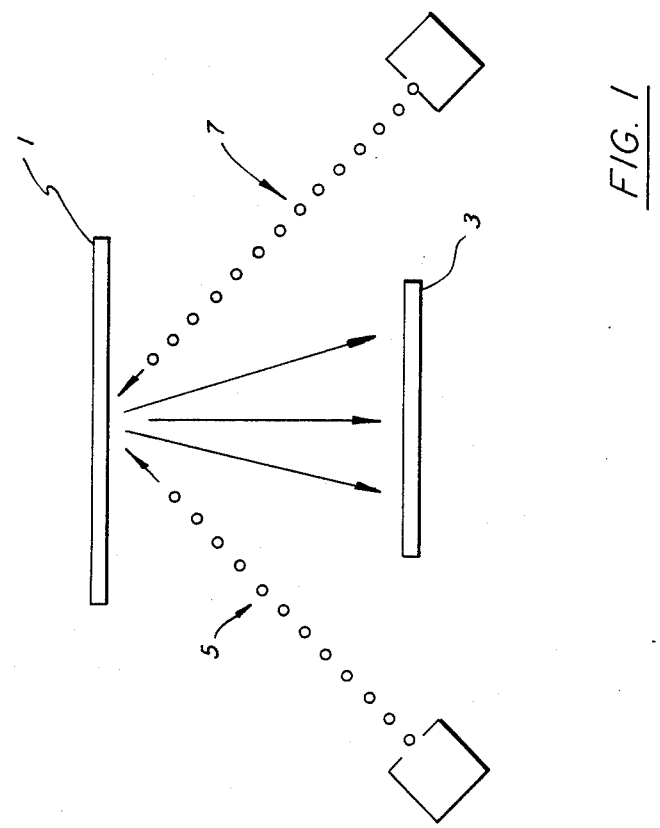
FIG. 1 is a schematic view of the arrangement of a target, substrate and ion beam directions for performing the inventive process.

An arrangement for carrying out the novel process is shown in FIG. 1. A sputter target 1, which is gradually consumed in the sputtering process, is disposed opposite a substrate 3, on which the deposition species produced in the process are collected to form a film. A beam 5 of relatively heavy sputtering ions is directed at target 1 from a conventional ion gun, not shown. The ion gun may be of the Kaufman type in which ions are formed in crossed electrical and magnetic fields. Electrons emitted from a central cathode follow spiral paths through the magnetic field toward a circumferential anode. The electrons form ions from gaseous atoms introduced into the gun between cathode and anode. The ions formed are accelerated out of the gun by an electrically charged accelerating grid. Just inside the gun from the accelerating grid is a screen grid maintained at a slightly different potential than the accelerating grid to protect the accelerating grid from ion impacts. Typically the sputtering ions are argon ions supplied to the beam source as argon gas. Other noble gases can be used as ion sources as well. The voltage applied to the ions in the sputtering beam source ranges from 750 to 1500 volts.

A second beam 7 of low energy ions is directed at target 1 from a different direction. To achieve the best results, I prefer that the low energy ions have energies not greater than about 20 electron volts and no less than about 3 to 4 electron volts. A conventional Kaufman ion source cannot produce such low energy ions while sustaining a desired beam current. Therefore, I have found it necessary to modify a 2.5 cm. Kaufman source to produce ions with the desired energy at an acceptable beam current. In order to increase the current of the beam at low voltage, the screen grid is removed. As a result, the width of the dark space in the plasma within the Kaufman gun determines the beam current. The width of the dark space varies in a complex way with the absolute value of the anode voltage, permitting the beam current to be maintained at a desired level, although the voltage on the anode is reduced to produce ion energies between 3 and 20 electron volts. The ions in the second beam are also derived from a gas which may be elemental, such as hydrogen, oxygen or nitrogen, or a compound, such as silane and germane.

In the arrangement of FIG. 1, substrate 1 may be heated, for example, by an electrical current flowing through a substrate holder or by heat lamps to aid the deposition process. Typically, the range of substrate temperatures used in the novel process are 20° C. to 400° C. The substrate may, for example, be glass, quartz, silicon, a metal or metal alloy. Typically, the vacuum in which the process is performed is maintained at about 0.13 to $1.33 \times 10^{-3}$ pascal.

In the arrangement of FIG. 1, the target may be silicon, germanium, molybdenum, nickel, etc. The ions in the low energy beam may be hydrogen, oxygen, nitrogen, fluorine, etc. By choosing the proper combinations from these exemplary lists, films of silicon oxides, hydrogenated silicon, nitrides, germanium-silicon alloys and other compounds and alloys can be produced.

I have deposited numerous films of silicon oxides at room temperature by the novel process using argon ions as a sputtering beam, a silicon target and a low energy oxygen ion beam. Those oxide films have been analyzed by spectroscopic ellipsometry and show the same dielectric constant as does bulk silicon dioxide, even when the films are very thin. The same technique was used to measure the density of the films and demonstrated that the films had already reached their maximum density when only 2 nanometers thick. Using x-ray spectroscopy techniques, it was determined that the film had a formula of $SiO_x$ where x equalled 2.0.

Figure 2:
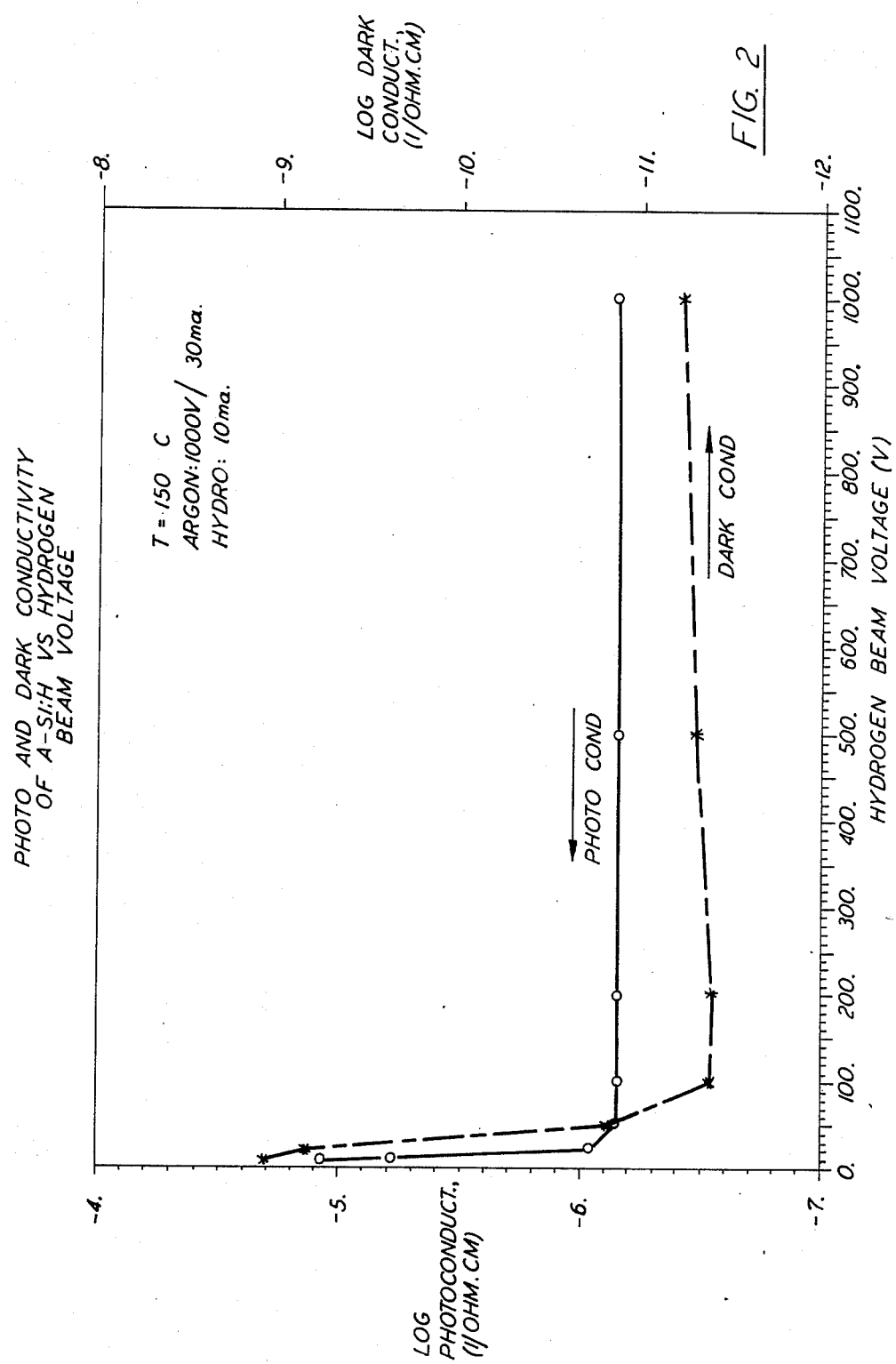
FIG. 2 is a graph of measured photoconductivity and dark current of hydrogenated amorphous silicon films deposited by a known dual ion beam process and according to the invention.

Many hydrogenated amorphous silicon films have been deposited by the new process using an argon beam, a silicon target and low energy hydrogen beam. These films not only have higher densities than other dual ion beam sputtered hydrogenated silicon films, but show substantially improved photoconductivities. In FIG. 2, the measured dark conductivity (broken line) and photoconductivity (solid line) are plotted for films deposited according to the new process and by a known dual ion beam process in which both beams are directed at the target. The latter process is disclosed in U.S. patent application Ser. No. 647,208 filed Sept. 4, 1984 now abandoned in favor of U.S. patent application Ser. No. 814,837, filed Dec. 30, 1985. In that application, the hydrogen beam voltage employed was 100, 150 or 200 volts and the deposited films showed an optimized quality at a beam voltage of 150 volts. Those films showed maximum logarithmic dark conductivities and photoconductivities of $-11$ and $-6.8$ respectively. Films prepared according to that earlier disclosed process are shown in FIG. 2 for hydrogen ion beam voltages of about 100 volts or more.

Figure 3:
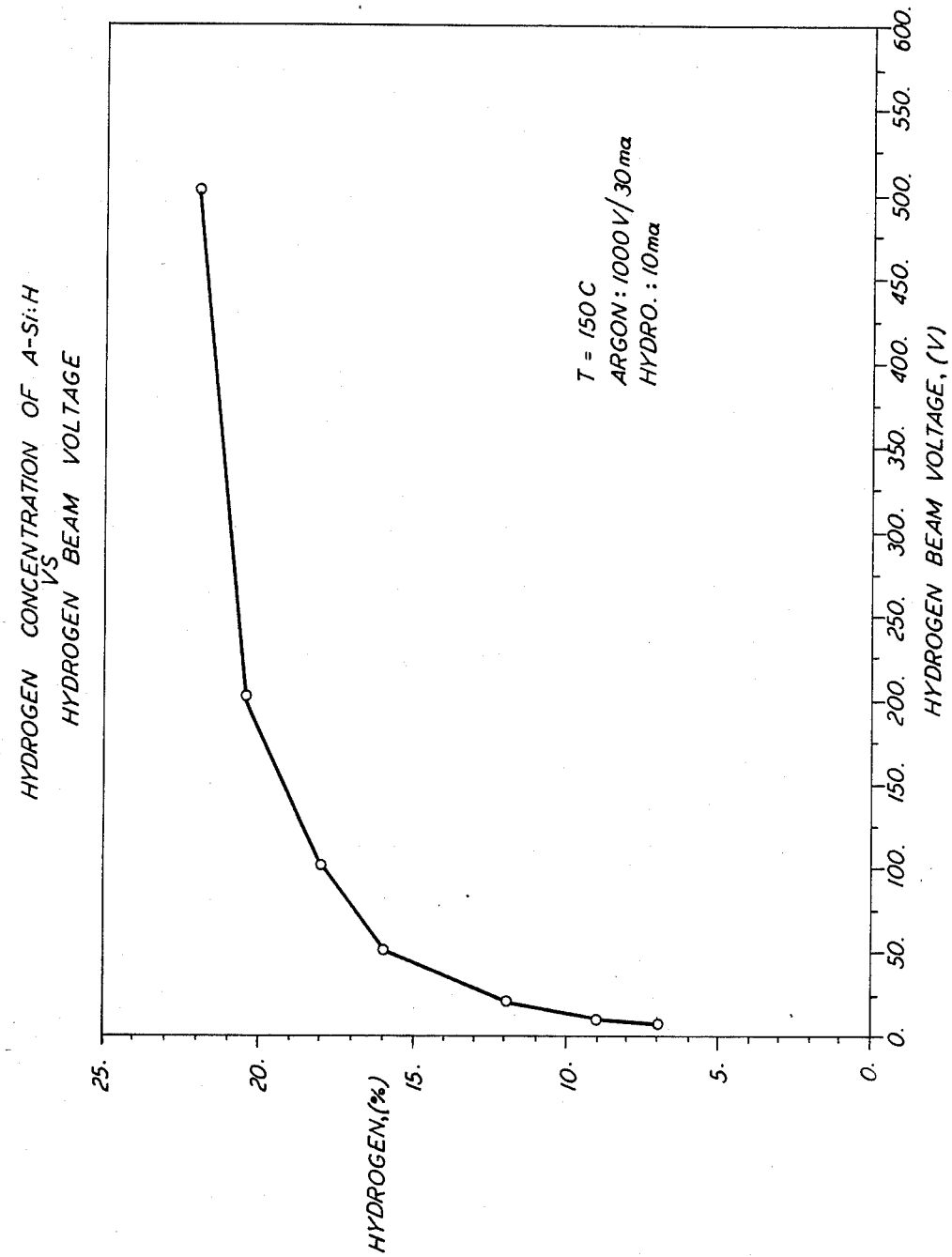
FIG. 3 is a graph of the measured hydrogen incorporation in hydrogenated amorphous silicon films deposited by a known dual ion beam process and according to the invention.

Films of hydrogenated amorphous silicon prepared according to the novel process are shown in FIG. 2 for the plotted data points corresponding to hydrogen beam voltages less than about 40 volts. (The logarithm of dark conductivity is displayed on the right ordinate and the logarithm of photoconductivity is displayed on the left ordinate). As is apparent from the graph, both dark current and photoconductivity increase dramatically, more than an order of magnitude, when the hydrogen beam voltage drops below about 20 volts, i.e. when the energy of the ions is below 20 electron volts. As indicated on FIG. 2, the deposition results plotted there were all for substrate temperatures of 150° C., sputtering beams of argon ions at 1000 volts and 30 milliampere currents and hydrogen beam currents of 10 milliamperes. The amount of hydrogen incorporated in the films decreases sharply as the hydrogen beam voltage is reduced to the range of the novel process. See FIG. 3.

In order to optimize the improved results shown in FIG. 2, I find it important to avoid contamination of the depositing films by heavy metal ions. While the arrangement of FIG. 1 shows the sputtering and low energy ion beams striking only the target, in practice some of the ions in the beams miss the target and can strike the walls of the vacuum chamber in which the deposition takes place. Since the typical vacuum chamber may have a metal wall or base plate, the stray ions can sputter heavy metal ions into the chamber and onto the substrate. To avoid this source of contamination, I prefer to use a curtain of high purity silicon wafers to shroud the volume between the target and substrate.

A hydrogenated silicon-germanium alloy film may be deposited by using a silicon target and a low energy beam of ions formed from germane gas.

The precise mechanism resulting in the deposition of the high density amorphous films is not known. In the typical sputtering process a growing film is constantly bombarded with sputtered atoms or electrons of relatively high energy. These atoms may well cause some sputtering or structural damage the depositing film, such as the creation of voids, reducing its density. In addition, some of the sputtering gas atoms may be incorporated in the depositing film. In the novel process the low energy ions interact with the target and/or with atoms sputtered from the target to form the depositing species. The substrate is not bombarded with species having energies that may damage the film. In addition, the number of sputtering gas ions incorporated into films prepared according to the novel process is quite low. A typical secondary ion mass spectroscopy (SIMS) measurement of films deposited according to the invention shows about $10^{-3}$ percent of argon in a hydrogenated amorphous silicon film.

The invention has been described with reference to certain preferred embodiments. Various modifications and additions without departing from the spirit of the invention will occur to those of skill in the art. Accordingly, the scope of the invention is limited solely by the following claims.

I claim:

1. A process for depositing a hydrogenated amorphous silicon film on a substrate comprising:
   simultaneously directing a first beam of ions effective in sputtering and a second beam of hydrogen ions against a silicon target, said hydrogen ions having energies not exceeding about 20 electron volts, and collecting on said substrate the product of said beams as a film of hydrogenated amorphous silicon.

2. The process of claim 1 wherein said hydrogen ions have energies not less than about 3 electron volts.

3. The process of claim 1 wherein said ions effective in sputtering comprise argon ions.

4. The process of claim 1 including maintaining said substrate at a temperature of between 20° C. to 400° C. during said deposition process.

5. The process of claim 1 wherein said substrate is selected from the group consisting of glass, quartz, silicon, metallic elements and metal alloys.

6. The process of claim 1 including maintaining the ambient pressure during said deposition process between 0.13 to $1.3 \times 10^{-3}$ pascal.

* * * * *